US009093515B2

(12) United States Patent
Uehling et al.

(10) Patent No.: US 9,093,515 B2
(45) Date of Patent: Jul. 28, 2015

(54) WIRE BONDING CAPILLARY WITH WORKING TIP PROTRUSION

(71) Applicants: Trent Uehling, New Braunfels, TX (US); Ilko Schmadlak, Feldkirchen (DE)

(72) Inventors: Trent Uehling, New Braunfels, TX (US); Ilko Schmadlak, Feldkirchen (DE)

(73) Assignee: Freescale Semiconductor, Inc., Austin, TX (US)

( * ) Notice: Subject to any disclaimer, the term of this patent is extended or adjusted under 35 U.S.C. 154(b) by 128 days.

(21) Appl. No.: 13/944,445

(22) Filed: Jul. 17, 2013

(65) Prior Publication Data

US 2015/0021376 A1 Jan. 22, 2015

(51) Int. Cl.
B23K 31/02 (2006.01)
H01L 23/00 (2006.01)
B23K 20/00 (2006.01)

(52) U.S. Cl.
CPC ............. *H01L 24/78* (2013.01); *B23K 20/005* (2013.01); *B23K 20/007* (2013.01); *H01L 24/85* (2013.01)

(58) Field of Classification Search
None
See application file for complete search history.

(56) References Cited

U.S. PATENT DOCUMENTS

| 3,672,047 A * | 6/1972 | Sakamoto et al. ............... 29/854 |
| 4,219,143 A * | 8/1980 | Gailland ........................ 228/159 |
| 4,415,115 A * | 11/1983 | James ........................... 228/170 |
| 5,421,503 A * | 6/1995 | Perlberg et al. ................ 228/4.5 |
| 5,871,141 A * | 2/1999 | Hadar et al. ................ 228/180.5 |
| 5,906,308 A * | 5/1999 | Yamazaki et al. ............. 228/4.5 |
| 5,931,368 A * | 8/1999 | Hadar et al. ..................... 228/4.5 |
| 6,041,995 A * | 3/2000 | Takahashi et al. ............. 228/164 |
| 6,065,667 A * | 5/2000 | Singh ......................... 228/180.5 |
| 6,158,647 A * | 12/2000 | Chapman et al. .......... 228/180.5 |
| 6,207,549 B1 * | 3/2001 | Higashi et al. ................ 438/613 |
| 6,244,499 B1 * | 6/2001 | Tsai et al. .................. 228/180.5 |
| 6,457,627 B1 | 10/2002 | Komiyama |
| 6,910,612 B2 | 6/2005 | Perlberg et al. |
| 7,137,547 B2 * | 11/2006 | Wakefield ................... 228/180.5 |
| 7,621,436 B2 * | 11/2009 | Mii et al. .................... 228/180.5 |
| 8,053,351 B2 * | 11/2011 | Ryu et al. ...................... 438/617 |
| 8,143,155 B2 | 3/2012 | Mii et al. |
| 2002/0079349 A1 * | 6/2002 | Macover ......................... 228/4.5 |
| 2002/0130158 A1 * | 9/2002 | Boller et al. ................... 228/103 |
| 2003/0015567 A1 | 1/2003 | Perlberg et al. |

(Continued)

OTHER PUBLICATIONS

Ba Le, Minh-Nhat; "Advanced Thermosonic Wire Bonding Using High Frequency Ultrasonic Power: Optimization, Bondability, and Reliability," Thesis at California Polytechnic State University, Jun. 2009, San Luis Obispo, US.

(Continued)

*Primary Examiner* — Kiley Stoner

(57) ABSTRACT

A method for bonding a wire to a substrate includes forming a wire ball at a working tip of a capillary and contacting the wire ball to a substrate via the capillary. The method also includes driving a protrusion at the working tip of the capillary into contact with a region of the substrate surrounding the wire ball. A capillary for wire bonding includes a working face, an annular chamfer section, and a cylindrical bore offsetting the annular chamfer section from the working face. A capillary for wire bonding includes a capillary body comprising a working tip having a working face. The capillary body defines an axial passage extending from the working face along a longitudinal axis of the capillary. The axial passage includes a cylindrical bore extending internally from the working face, and a first annular chamfer having a major diameter defined by the cylindrical bore.

24 Claims, 6 Drawing Sheets

(56) References Cited

U.S. PATENT DOCUMENTS

| | | | |
|---|---|---|---|
| 2004/0041008 A1* | 3/2004 | Mochida | 228/180.5 |
| 2004/0104477 A1* | 6/2004 | Fujisawa | 257/738 |
| 2005/0092815 A1* | 5/2005 | Mii | 228/180.5 |
| 2005/0218188 A1* | 10/2005 | Lee et al. | 228/4.5 |
| 2005/0284913 A1* | 12/2005 | Lim et al. | 228/4.5 |
| 2005/0284916 A1* | 12/2005 | Ishikawa | 228/110.1 |
| 2006/0079008 A1* | 4/2006 | Nishimaki et al. | 438/11 |
| 2006/0175383 A1* | 8/2006 | Mii et al. | 228/180.5 |
| 2006/0216863 A1* | 9/2006 | Arakawa | 438/118 |
| 2008/0054052 A1* | 3/2008 | Arakawa | 228/244 |
| 2012/0074206 A1* | 3/2012 | Qin et al. | 228/102 |
| 2014/0374467 A1* | 12/2014 | Yap et al. | 228/180.5 |

OTHER PUBLICATIONS

CoorTek, Inc., "Capillary Wire Bonding," pp. 5-40, Gaiser Products Group, Ventura, California, USA, Downloaded from <<http://www.nordson.com/de-de/divisions/dage/products/materialien/CoorsTek/Documents/CoorsTek_StdCap.pdf>> on May 13, 2013.

* cited by examiner

WIRE BONDING CAPILLARY WITH WORKING TIP PROTRUSION

BACKGROUND

1. Field of the Disclosure

The present disclosure relates generally to the bonding of wire to semiconductor devices and, more particularly, to wire bonding using a capillary.

2. Description of the Related Art

Wire bonding is used to form wire connections between pads of a semiconductor device and pads of a substrate (e.g., an interposer or printed circuit board), between a semiconductor device and a lead frame or between two semiconductor devices. A wire bonding tool uses an external electrode to form a metal ball, via electric flame off (EFO) at the end of a feed wire. This metal ball is then placed in contact with a bond pad via a capillary and bonded with the bond pad through a combination of heat, pressure, and ultrasonic vibration energy. In certain implementations, such as the bonding of copper wire to aluminum pads, this process can result in metal material of the bond pad being pushed out and away from the ball bond site. This displaced metal, or "splash," can result in a short-circuit to adjacent bond pads. Moreover, this splash can prevent adequate welding between the ball and the bond pad substrate, which can lead to a crevice forming at the edge of the ball-pad bond (hereinafter, "ball bond"). This crevice can result in accelerated corrosion of the intermetallic coverage (IMC) formed between the ball and pad. Moreover, this crevice also can fill with mold compound resin during the device packaging process. The thermal expansion of the mold compound in the crevice can weaken, and subsequently lead to the failure of, the ball bond. In either event, the reliability of the resulting semiconductor device can be compromised by the pad metal splash generated by conventional wire bond techniques.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-7 illustrate example techniques for wire bonding a workpiece using a capillary having a working tip with an annular protrusion that serves to provide improved wire-pad bonding and to reduce the incidence of inter-pad shorts due to bond pad splash. For ball bonding, the capillary is manipulated to drive the annular protrusion into contact with the bond pad substrate after initial contact is made between a wire ball and the bond pad substrate. With the annular protrusion in contact with the bond pad substrate, the working tip serves to confine bond pad splash to the region within an internal chamber formed by the working tip and its annular protrusion, thereby reducing or eliminating the potential for inter-pad shorts due to bond pad splash. Further, in some embodiments, the annular protrusion is driven so as to penetrate the bond pad substrate, thereby deforming the bond pad material at the point of penetration. This deformation pushes the bond pad material against the sidewalls of the ball, thereby facilitating improved intermetallic coverage (IMC) formation at the ball bond and reducing the prevalence and extent of crevices between the ball and the bond pad substrate. This in turn leads to increased wire bond reliability. For stitch bonding (also commonly referred to as wedge bonding), a wire loop is drawn from the ball bond site and the wire loop at its distal end is bonded to the stitch bond pad substrate. After the stitch bond is formed between a side surface of the wire loop and the stitch bond pad, the capillary is manipulated to press the annular protrusion into the wire adjacent to the stitch bond site such that the annular protrusion at least partially cleaves the wire and thus allows the wire to break away from the bond site with less required force and with more consistent results compared to conventional stitch bonding techniques. Note that while ball bonding techniques are described herein in the context of wire loop bonding, these techniques also may be employed to form stud or bump ball bonds used in, for example, stacked die applications, and thus references herein to wire loop ball bonds apply equally to stud or bump balls unless otherwise noted.

Figure 1:
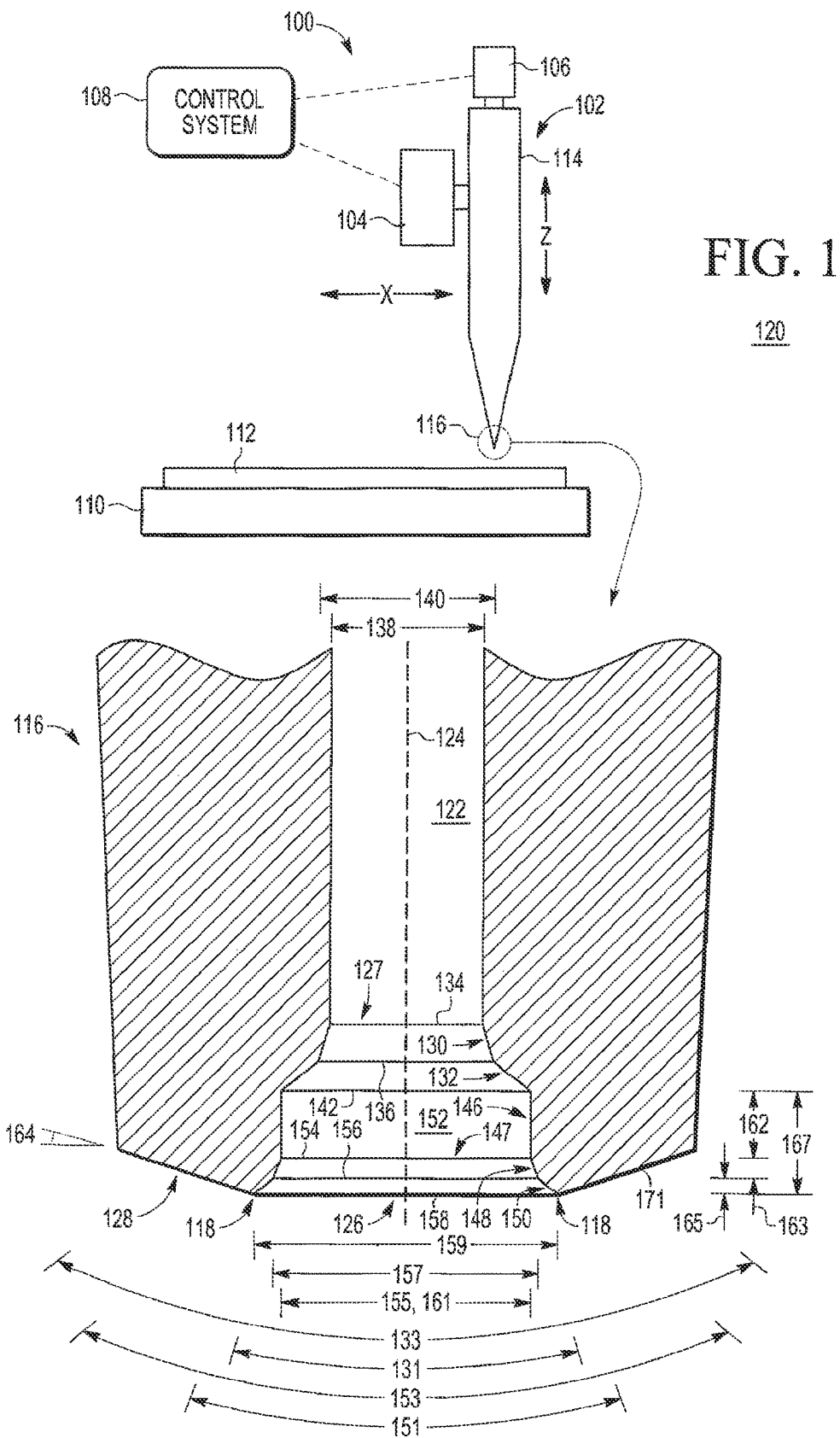
FIG. 1 is a diagram of a bonding tool having a capillary with a working tip protrusion for forming wire bonds on a workpiece in accordance with some embodiments.

FIG. 1 illustrates a bonding tool 100 for wire bonding workpieces in accordance with some embodiments. The bonding tool 100 comprises a capillary 102, a servo system 104, an ultrasonic transducer 106, a wire feed system (not shown), a computer control system 108, and a work chuck 110 to secure a workpiece 112 for the wire bonding process. The capillary 102 includes a capillary body 114 extending along a longitudinal axis (illustrated as the Z-axis in FIG. 1) and terminating at a working tip 116 facing the work chuck 110. Although the capillary body 114 is illustrated as having a straight cone taper, the capillary body 114 may implement any of a variety of tapers known in the art, including a straight bottle neck taper, an angled bottleneck taper, a single side-relief taper, or a double side-relief taper. The capillary 102 may be formed from any of a variety of materials, including ceramic materials, such as zirconia toughened alumina ceramic, metals or metal alloys, such as tungsten carbide, or combinations thereof. The workpiece 112 can include, for example, one or more semiconductor chips being wire bonded to an interposer or other substrate or one or more semiconductor chips being bonded to a lead frame. Note that while the depicted example includes only a single capillary 102 and a single workpiece 112, in implementation the bonding tool 100 may incorporate multiple capillaries 102 that operate concurrently on multiple workpieces 112.

The computer control system 108 operates the servo system 104 to manipulate the position of the capillary 102 relative to the work chuck 110 so as to position the working tip 116 over a bond pad site of the workpiece 112. If a ball bond is to be formed at the bond site, a free air ball is formed at the tip of the wire fed through the capillary 102 using an EFO process or other ball-forming process, the wire is drawn back to secure the free air ball in an annular chamfer section at the working tip 116, and the capillary 102 is manipulated by the servo system 104 so as to bring the ball into contact with the bond site in order to form a ball bond through pressure applied by the downward force of the working tip 116 on the ball, sonic energy applied by the ultrasonic transducer 106, and heat energy applied through heating of the work chuck 110. If a stitch bond is to be formed at the bond site, the capillary 102 is manipulated to lay a portion of wire loop initiated from a ball bond site across the bond pad site, and pressure and ultrasonic vibration energy from the working tip 116, along with heat from the work chuck 110, together act to bond a side portion of the wire to the bond pad site. The capillary 102 is then again manipulated by the servo system 104 so as to draw the working tip 116 from the bond pad site, thereby placing a drawing force on the wire that causes the remaining wire to separate from the wire loop at the stitch bond site.

In some embodiments, the efficacy of this wire bonding process is enhanced through the presence of an annular protrusion 118 at the working tip 116. During the ball bonding process, the servo system 104 manipulates the capillary 102 so as to drive the annular protrusion 118 into contact with the bond pad substrate, thereby allowing the working tip 116 and the bond pad substrate to together form a chamber that encloses the ball bond and region of the bond pad substrate in proximity to the ball bond. This enclosed chamber prevents bond pad material from moving laterally away from the ball bond, and thus reduces or eliminates splash of the material of the bond pad substrate onto adjacent bond pads or other adjacent structures. Rather than being placed in actual contact, in some embodiments, the servo system 104 manipulates the capillary 102 so that the annular protrusion 118 is placed proximate to the surface of the bond pad substrate, and this proximity effectively forms a chamber that sufficiently encloses the ball bond and bond pad region to reduce or eliminate bond pad splash.

Moreover, in addition to making contact with the surface of the bond pad substrate, in some embodiments, the servo system 104 manipulates the capillary 102 so as to drive the annular protrusion 118 at least partially into the bond pad substrate, thereby forcing bond pad substrate material against the sidewall of the ball. This increased intimate contact between the bond pad substrate material and the ball promotes improved IMC and thus reduces the prevalence of crevices between the ball and bond pad substrate. During the stitch bonding process, the servo system 104 can manipulate the capillary 102 so as to drive the annular protrusion 118 at least partially into the wire proximate to the stitch bond site, thereby at least partially cleaving the wire. This cleaving of the wire results in less force required to be exerted by the capillary 102 on the wire in order to break away the wire from the stitch bond site, as well as providing a more reliable wire breakage pattern.

Cross-section view 120 the working tip 116 of FIG. 1 illustrates one example implementation of the working tip 116 including the annular protrusion 118. For purposes of the following description, the end of the working tip 116 that is to face the workpiece 112 is referred to as the "distal" end of the working tip 116. The capillary body 114 of the capillary 102 defines an axial passage 122 extending along a longitudinal axis 124 (e.g., the Z-axis) of the capillary 102 and terminating as an opening 126 at a working face 128 at the distal end of the working tip 116, whereby the working face 128 comprises the primary surface or surfaces of the working tip 116 that face the workpiece 112 and work chuck 110.

The axial passage 122 also defines an annular chamfer section 127, a cylindrical bore 146, and an annular chamfer section 147. The annular chamfer section 127 comprises one or a series of inside chamfers that are used to secure a free air ball during the ball bond process. In the depicted example, the annular chamfer section 127 comprises two inside chamfers 130 and 132 having chamfer angles 131 and 133, respectively, whereby the chamfer angle 133 is greater than the chamfer angle 131. In other embodiments, the annular chamfer section 127 can include a single inside chamfer or more than two inside chamfers. The inside chamfer 130 has a minor diameter 134 and a major diameter 136, with the minor diameter 134 substantially equal to a diameter 138 of a proximal segment of the axial passage 122 abutting the inside chamfer 130 and the major diameter 136 having a diameter 140. The major diameter 136 of the inside chamfer 130 forms the minor diameter of the inside chamfer 132, which also has a major diameter 142 having a diameter 155.

The annular chamfer section 147 likewise comprises one or a series of inside chamfers. In the depicted example, the annular chamfer section 147 comprises two inside chamfers 148 and 150 having chamfer angles 151 and 153, respectively, whereby the chamfer angle 153 is greater than the chamfer angle 151. In other embodiments, the annular chamfer section 147 can include a single inside chamfer or more than two inside chamfers. The inside chamfer 148 has a minor diameter 154 and a major diameter 156, with the minor diameter 154 having the diameter 155. The major diameter 156 of the inside chamfer 148 has a diameter 157, and forms the minor diameter of the inside chamfer 150. The inside chamfer 150 has a major diameter defined by the opening 126, which has a diameter 159. The inside chamfers 148 and 150 have a length 163 and a length 165, respectively, measured parallel to the longitudinal axis 124.

The cylindrical bore 146 has an inner diameter 161 (which, in the illustrated embodiment, is substantially equal to the diameter 155) and a length 162 extending from the perimeter of the annular chamfer section 127 defined by the major diameter 142 of the inside chamfer 132 to the perimeter of the inner chamfer section 147 defined by the minor diameter 154 of the inside chamfer 148. This cylindrical bore 146, together with the annular chamfer section 147, serves to offset the annular chamfer section 127 from the opening 126 at the working face 128 by a distance 167, and thus forms, in combination with annular chamfer section 147 and the particular profile of the working face 128, at least a portion of the annular protrusion 118 that extends outward from the base of the working face 128. Moreover, the cylindrical bore 146 forms, along with the annular chamfer sections 127 and 147 and the working face 128 or annular protrusion 118, a chamber 152 that serves to confine wire ball material and pad substrate material within the working tip 116 during ball bond formation, which helps to prevent bond pad splash.

In the particular example depicted in cross-section view 120, the working face 128 of the working tip 116 is composed of two features: the annular chamfer section 147 and an annular flat ring 171. The annular flat ring 171 comprises a substantially flat annular surface forming the outer perimeter of the working face 128 and extending radially inward to the annular chamfer section 147. The annular flat ring 162 has a face angle 164. The annular chamfer section 147 and the cylindrical bore 146 serve to "protrude" from the annular chamfer section 127 used to secure a wire ball, and thus the annular chamfer section 147 and the annular flat ring 171 form an annular lip that circumscribes the opening 126 of the axial passage 122.

Figure 5:
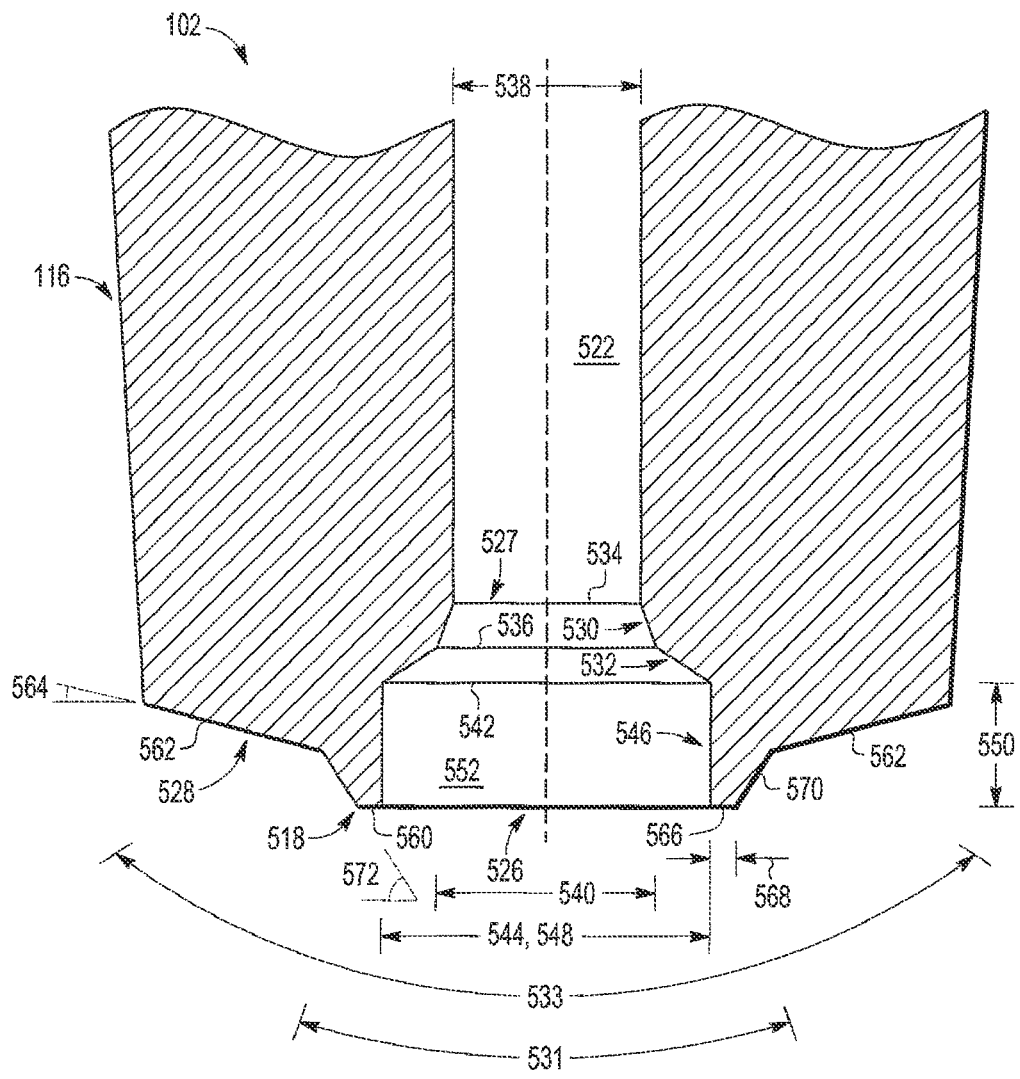
FIG. 5 is a cross-section view of another implementation of the working tip of the capillary of the bonding tool of FIG. 1 in accordance with some embodiments.
Figure 6:
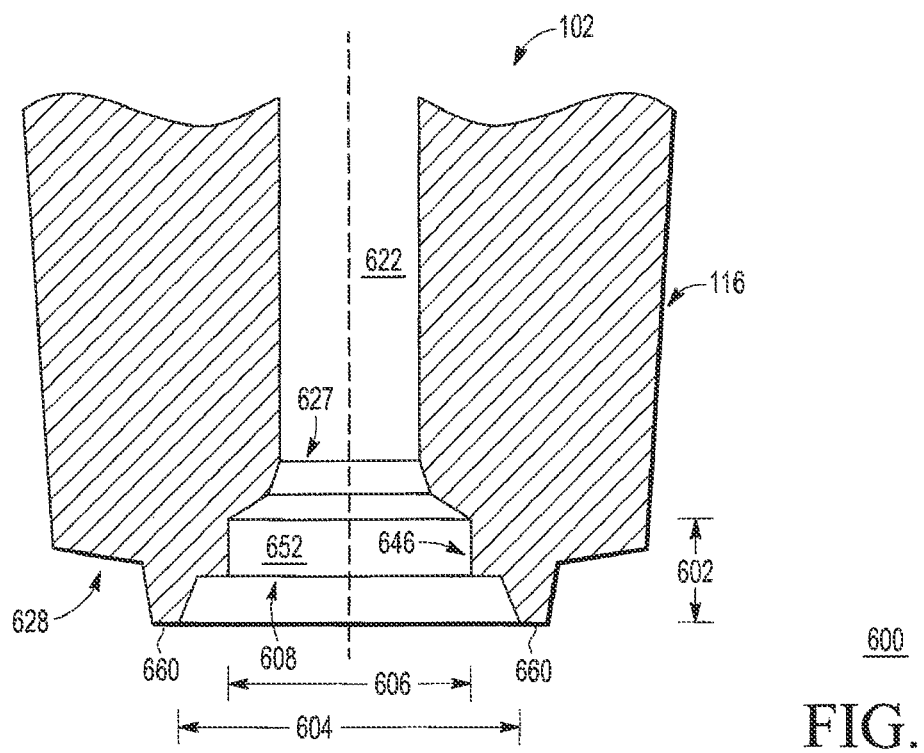
FIG. 6 is a cross-section view of yet another implementation of the working tip of the capillary of the bonding tool of FIG. 1 in accordance with some embodiments.

In addition to serving to form a portion of the chamber 152 that confines ball bond material, the annular lip of the annular protrusion 118 also may be driven into the bond pad substrate so as to further seal the chamber 162 as well as to drive bond pad substrate material against the ball material in a snow-plow-like action. The annular protrusion 118 also may serve to cleave the wire during a stitch bond process. As such, the lip of the annular protrusion may be formed with a wedge profile as illustrated in FIG. 1 (or a blade profile as illustrated in FIGS. 5 and 6 below) to facilitate penetration into the bond pad substrate or wire.

Table 1 below illustrates various example values or ranges of the dimensions described for an example implementation using a wire having a diameter of 22 micrometers (μm):

TABLE 1

Example Dimensions for 22 μm Wire

| Dimension: | Value(s)/Range(s) in [unit]: |
|---|---|
| Axial Passage Diameter 138 | 24-28 μm |
| Minor Diameter 140 | 29.5-31.5 μm |
| Minor/Major Diameter Ratio of Inside Chamfer 130 | 0.84-0.87 |
| Major Diameter 142 | 38-40 μm |
| Inside Chamfer Angle 131 | 33-37 deg. |
| Inside Chamfer Angle 133 | 63-67 deg. |
| Minor Diameter 154 | 38-46 μm |
| Minor/Major Diameter Ratio of Inside Chamfer 148 | 0.95-0.97 |
| Chamfer Length 163 | 1.5-2.5 μm |
| Chamfer Length 165 | 0.8-1.2 μm |
| Inside Chamfer Angle 151 | 46-50 deg. |
| Inside Chamfer Angle 133 | 125-130 deg. |
| Face Angle 164 | 5-10 deg. |
| Cylindrical Bore Length 162 | 10-11 μm |
| Cylindrical Bore Diameter 161 | 38-40 μm |

Although cross-section view 120 illustrates one example implementation of the working tip 116, the working tip 116 instead may have other configurations that form a confinement chamber that extends distally from an annular chamfer section to a distal opening at the working face of the working tip, and which also may include an annular projection extending from the working face to provide working tip penetration into the bond bad substrate. Examples of such working tips are described below with reference to FIGS. 5 and 6.

Figure 2:
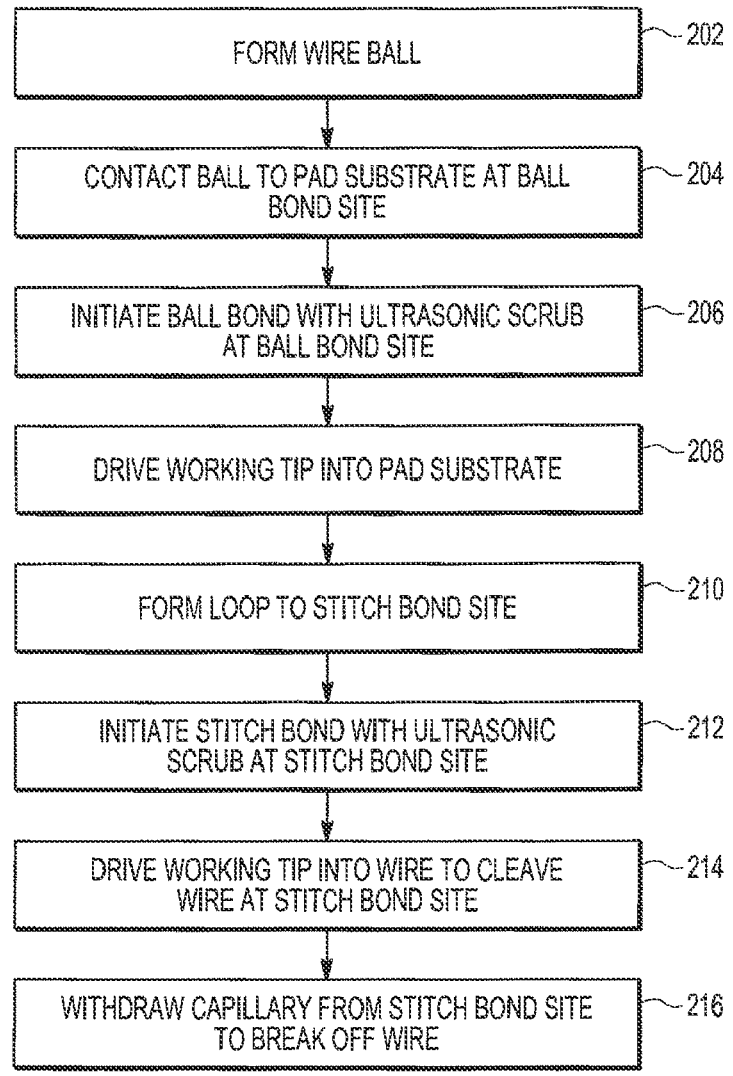
FIG. 2 is a flow diagram illustrating a method for wire bonding in accordance with some embodiments.
Figure 3:
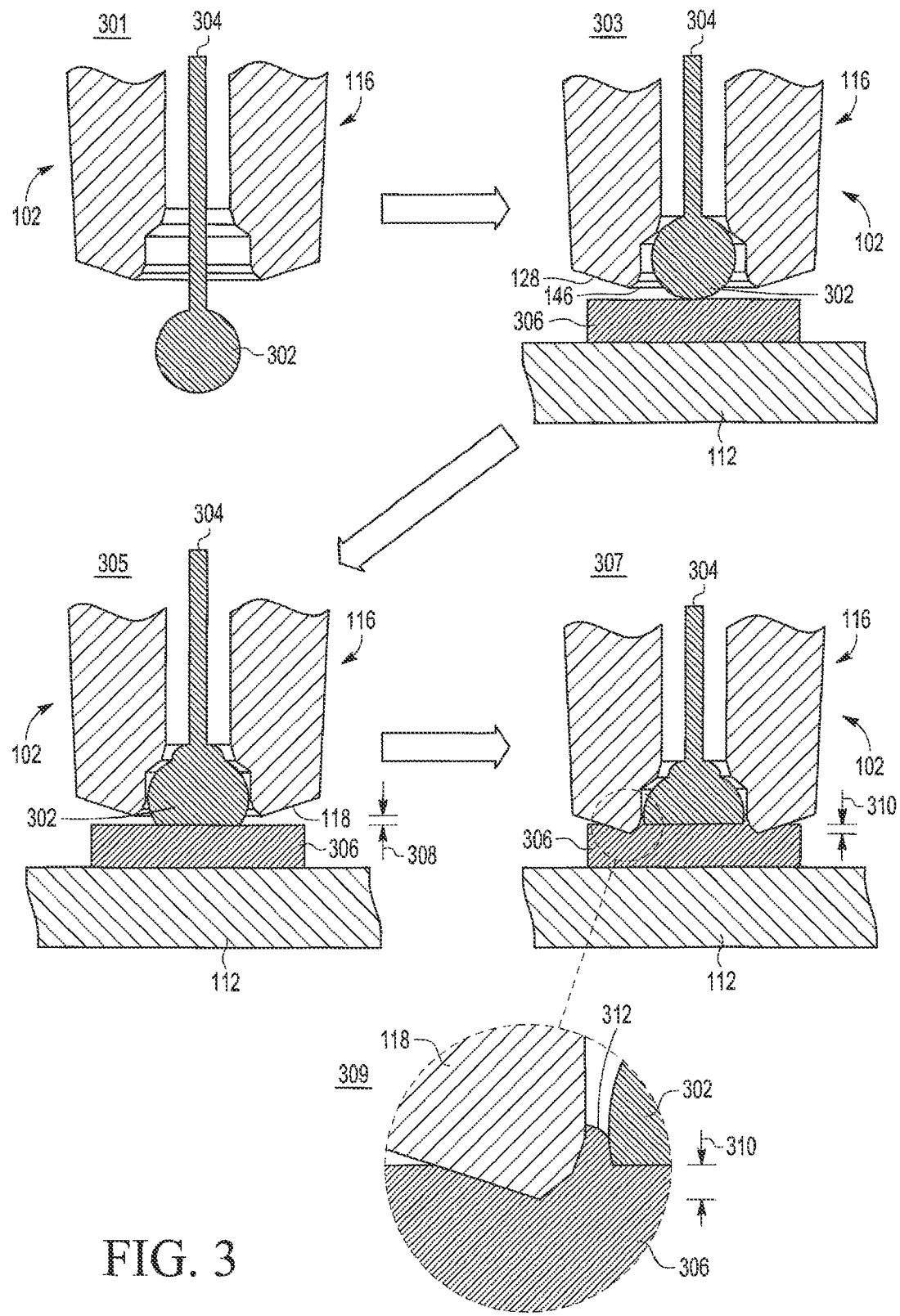
FIG. 3 is a series of cross-section views of a manipulation of a working tip of a capillary at a ball bond site to illustrate a ball bonding process of the method of FIG. 2 in accordance with some embodiments.
Figure 4:
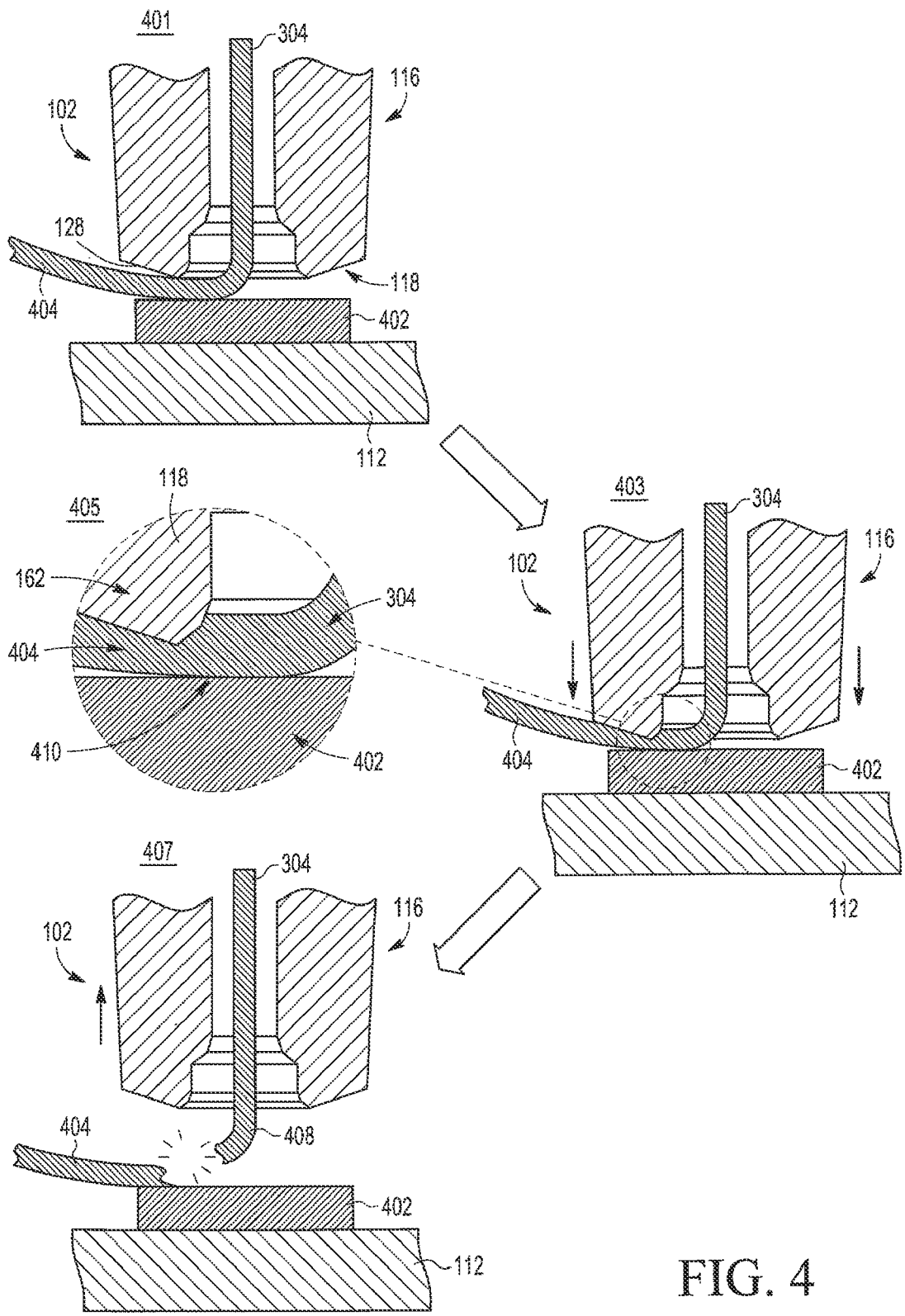
FIG. 4 is a series of cross-section views of a manipulation of a working tip of a capillary at a stitch bond site to illustrate a stitch bonding process of the method of FIG. 2 in accordance with some embodiments.

FIG. 2 illustrates an example method 200 for wire bonding using the bonding tool 100 of FIG. 1 in accordance with at least one embodiment. To facilitate understanding, FIG. 3 depicts a sequence of cross-section views of the working tip 116 and the workpiece 112 corresponding to sub-processes of a ball bonding process of method 200, and FIG. 4 depicts a sequence of cross-section views of the working tip 116 and the workpiece 112 corresponding to sub-processes of a stitch bonding process of method 200. Accordingly, FIGS. 3 and 4 will be referenced in the description of the method 200 below. Moreover, method 200 is described in an example context of copper (Cu) wire bonding to aluminum (Al) bond pads. However, the techniques described below may be applied for bonding a wire to a bond pad of similar or different composition, and are not limited to Cu and Al materials, but also may be used for wire bonding using, for example, gold (Au), silver (Ag), or palladium (Pd) wires or using bond pads composed of nickel (Ni), Pd, Au, Ag, and the like.

As illustrated by cross-section view 301 of FIG. 3, the method 200 initiates at block 202 with the formation of a wire ball 302 at a tip of a copper wire 304 threaded through the capillary 102. The wire ball 302 may be formed as a free air ball created through the melting of the tip of the wire 304 using, for example, an electronic flame off (EFO) process. At block 204, the wire 304 is slightly retracted to capture the wire ball 302 against the annular chamfer section 127 and the computer control system 108 (FIG. 1) controls the servo system 104 to manipulate the capillary 102 to bring the distal portion of the captured wire ball 302 into contact with an aluminum bond pad substrate 306 of the workpiece 112, as illustrated by the cross-section view 303 of FIG. 3. As depicted by cross-section view 303, the cylindrical bore 146 and the annular chamfer section 147 offset the annular chamfer section 127 from the working face 128 so that a substantial portion of the wire ball 302 is contained within the chamber 152 while the wire ball 302 is positioned against the annular chamfer section 127.

As illustrated by cross-section view 305 of FIG. 3, at block 206 the bonding tool 100 initiates cold welding, or bonding, of the wire ball 302 to the bond pad substrate 306 by performing an ultrasonic scrub process. This ultrasonic scrub process comprises the servo system 104 (FIG. 1) manipulating the capillary 102 along the Z-axis to apply downward pressure on the wire ball 302 via the annular chamfer section 127 while the ultrasonic transducer 106 vibrates the capillary 102 laterally along one or both of the X-axis and Y-axis. This ultrasonic scrub process has the effect of scrubbing the wire ball 302 against the bond pad substrate 306, which cleans the bond pad substrate 306 of any oxide and debris, and initiates plastic deformation, or plasticization, of the wire ball 302 and the bond pad substrate 306 against each other. Further, the work chuck 110 (FIG. 1) may heat the workpiece 112 so as to soften the aluminum material of the bond pad substrate 306 to aid this plasticization process. As this initial phase of the ultrasonic scrub process proceeds, the intimate contact between the wire ball 302 and the bond pad substrate 306 facilitates counter-diffusion of the metal of the wire ball 302 and the metal of the bond pad substrate 306, and this intermetallic formation welds the wire ball 302 to the bond pad substrate 306.

During the initial phase of the ultrasonic scrub process represented by block 206, the capillary 102 is positioned so that the annular protrusion 118 at the working face 128 is distanced from the surface of the bond pad substrate 306 by a gap 308 to allow the wire ball 302 to vibrate uninhibited. However, as the plasticization of the wire ball 302 and the bond pad substrate 306 progresses, the aluminum material of the bond pad substrate 306 has the potential to push away, or "splash", from the ball-pad contact area, which, as noted above, can lead to inter-pad shorts or the formation of crevices between the wire ball 302 and the bond pad substrate 306. Accordingly, to contain the aluminum material of the bond pad substrate 306, the final phase of the ultrasonic scrub process commences at block 208, whereby the servo system 104 manipulates the capillary 102 (or the work chuck 110) to drive the annular protrusion 118 into contact with, or proximate to, the bond pad substrate 306, thus confining the aluminum material in proximity to the bond-pad contact area within the chamber 152 (FIG. 1) defined by the annular protrusion 118, the cylindrical bore 146 (FIG. 1), and the bond pad substrate 306 itself. As such, the aluminum material is substantially contained by the working tip 116, thereby limiting bond pad splash while the ultrasonic scrub process completes the formation of the ball-pad bond.

In some embodiments, the bonding tool 100 does not stop at surface contact between the annular protrusion 118 and the bond pad substrate 306, but instead drives the annular protrusion 118 into the bond pad substrate 306 to a depth 310, as illustrated by cross-section view 307. To illustrate, assuming a diameter of 22 um for the wire ball 302, the initial phase of the ultrasonic scrub process may include positioning the capillary 102 relative to the bond pad substrate 306 such that the pad-facing surface of the annular protrusion 118 is maintained at a gap 308 of 2 um above the surface of the bond pad substrate 306, and during the final phase of the ultrasonic scrub process, the ultrasonic vibration action of the ultrasonic transducer 106 is ceased (that is, the ultrasonic scrub action is deactivated), and the capillary 102 is manipulated downward by 4 um, thereby closing the gap 308 and causing the annular protrusion 118 to penetrate the bond pad substrate 306 to a depth of 2 um. In such instances, the annular protrusion 118 typically is formed with a wedge-type or blade-type profile to facilitate this penetration of the bond pad substrate 306. As illustrated by expanded view 309, the annular protrusion 118 is shaped so that this penetration of the bond pad substrate 306 deforms the bond pad substrate 306 so as to push Al material 312 against the radius of the sidewall 314 of the wire ball 302. This intimate contact between the Al material 312 and the sidewall 314 of wire ball 302 facilitates IMC in this area, and thus reduces the extent of crevice formation between the wire ball 302 and the bond pad substrate 306.

After completion of the ultrasonic bond process to bond the wire ball 302 to the bond pad substrate 306, at block 210 the servo system 104 withdraws the capillary 102 from the ball bond site and repositions the capillary 102 at a stitch bond site comprising a bond pad substrate 402 (FIG. 4) of the workpiece 112, and forming a wire loop 404 (FIG. 4) between the bond pad site and the stitch pad site in the process. As illustrated by cross-section view 401 of FIG. 4, the wire 304 is laid against the surface of the bond pad substrate 402 and at block 212 another ultrasonic scrub process is initiated to form a stitch bond between the wire 304 and the bond pad substrate 402. As with the ultrasonic scrub process used to form the ball bond, the ultrasonic scrub process to form the stitch bond involves the application of pressure and ultrasonic vibration (and in some instances, heat) to weld the side of the wire 304 in contact with the bond pad substrate 402 to the bond pad substrate 402. However, in the stitch weld process, pressure is applied to the wire 304 via the working face 128 of the working tip 116.

As illustrated by cross-section view 403 and enlarged view 405 of FIG. 4, after the ultrasonic scrub process is completed to weld the wire loop 404 to the bond pad substrate 402, at block 214 the servo system 104 manipulates the capillary 102 so as to drive the annular protrusion 118 downward at least partially into the wire 304 so as to at least partially cleave the wire 304 at the site of the stitch bond weld 410. This has the effect of either completely separating the wire loop 404 from the remainder of the wire 304, or substantially weakening the wire 304 at the point of partial cleavage. Accordingly, as illustrated by cross-section view 407, when, at block 216, the servo system 104 manipulates the capillary 102 to withdraw from the stitch bond site, the remainder 408 of the wire 304 is able to more reliably and controllably break away from the wire loop 404, and with relatively less force required, compared to breaking away from a stitch bond formed without at least partial cleavage of the wire after bond formation. Moreover, referring again to the enlarged view 405, the profile of the annular protrusion 118 and the relatively shallow angle of the annular flat ring 171 adjacent to the annular protrusion 118 enables a relatively thick stitch bond heel, which results in an improved strength in the wire loop 404 at the stitch bond site.

Figure 7:
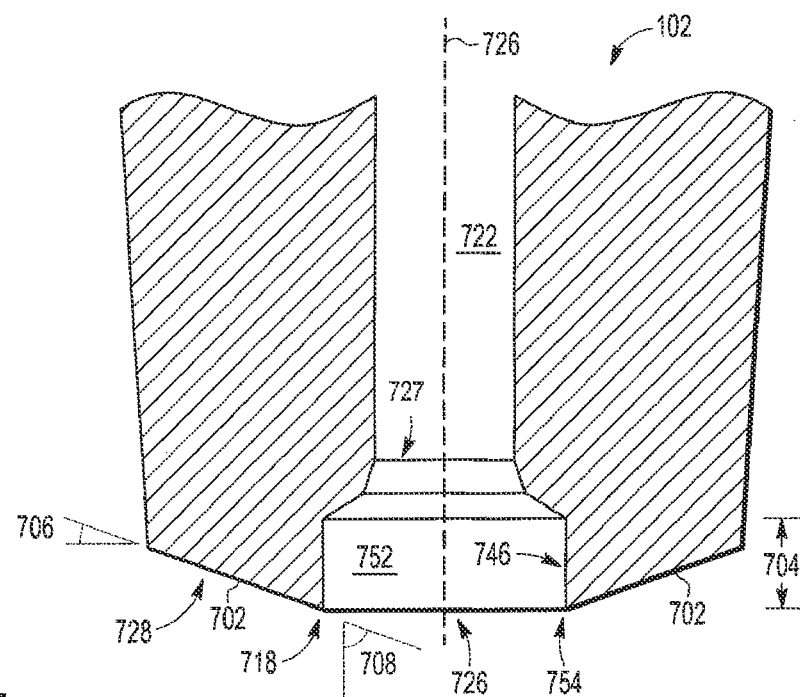
FIG. 7 is a cross-section view of another implementation of the working tip of the capillary of the bonding tool of FIG. 1 in accordance with some embodiments.

FIGS. 5-7 illustrate cross-section views of additional example implementations of the working tip 116 of the capillary 102 in accordance with some embodiments. In the example implementation represented by cross-section view 500, the working tip 116 of the capillary 102 terminates at an opening 526 at a working face 528 at the distal end of the working tip 116. An axial passage 522 defines an annular chamfer section 527 that comprises one or a series of inside chamfers. In the depicted example, the annular chamfer section 527 comprises two inside chamfers 530 and 532 having chamfer angles 531 and 533, respectively. In the illustrated example, the chamfer angle 533 is greater than the chamfer angle 531. In other embodiments, the annular chamfer section 527 can include a single inside chamfer or more than two inside chamfers. The inside chamfer 530 has a minor diameter 534 and a major diameter 536, with the minor diameter 534 substantially equal to a diameter 538 of a proximal segment of the axial passage 522 abutting the inside chamfer 530 and the major diameter 536 having a diameter 540. The major diameter 536 of the inside chamfer 530 forms the minor diameter of the inside chamfer 532, which also has a major diameter 542 having a diameter 544.

The axial passage 522 also defines a cylindrical bore 546 having an inner diameter 548 (which, in the illustrated embodiment, is substantially equal to the diameter 544) and a length 550 extending internally from the opening 526 to the perimeter of the inner chamfer 532 defined by its major diameter 542. This cylindrical bore 546 serves to offset the annular chamfer section 527 from the opening 526 at the working face 528, and thus forms, in combination with the particular profile of the working face 528, at least a portion of an annular protrusion 518 that extends outward from the base of the working face 528. Moreover, the cylindrical bore 546 forms, along with the annular chamfer section 527 and the working face 528 or annular protrusion 518, a chamber 552 that serves to confine wire ball material and pad substrate material within the working tip 116 during ball bond formation, which helps to prevent bond pad splash.

In the particular example depicted in cross-section view 500, the working face 528 of the working tip 116 is composed of two features: an annular lip 560 and an annular flat ring 562. The annular flat ring 171 comprises a substantially flat annular surface forming the outer perimeter of the working face 528 and extending radially inward to the annular lip 560. The annular flat ring 562 has a face angle 564. The annular tip 560 forms an annular protrusion from the working face 128 that circumscribes the opening 526 of the axial passage 522. In the illustrated example, the annular lip 560 forms a portion of the wall of the cylindrical bore 546 and defines the opening 526. In addition to serving to form a portion of the chamber 552 that confines ball bond material, the annular tip 560 also may be driven into the bond pad substrate so as to further seal the chamber 562 as well as to drive bond pad substrate material against the ball material in a snow-plow-like action. The annular lip 560 also may serve to cleave the wire during a stitch bond process. As such, the annular lip 560 may be formed with a wedge or blade profile to facilitate penetration into the bond pad substrate or wire. As illustrated, this wedge profile can include a parallel wall portion forming a segment of the cylindrical bore 546, an edge portion 566 having a width 568, and an angled wall portion having a face angle 572.

Table 2 below illustrates various example values or ranges of the dimension, described for an example implementation using a wire having a diameter of 22 micrometers (μm):

TABLE 2

Example Dimensions for 22 μm Wire

| Dimension: | Value(s)/Range(s) in [unit]: |
|---|---|
| Axial Passage Diameter 138 | 24-28 μm |
| Minor Diameter 140 | 29.5-31.5 μm |
| Minor/Major Diameter Ratio of Chamfer 130 | 0.84-0.87 |
| Major Diameter 144 | 38-40 μm |
| Inside Chamfer Angle 131 | 33-37 deg. |
| Inside Chamfer Angle 133 | 63-67 deg. |
| Face Angle 164 | 5-10 deg. |
| Face Angle 172 | 20-30 deg. |
| Lip Edge Width 168 | 0-2 μm |
| Cylindrical Bore Length 162 | 10-11 μm |
| Cylindrical Bore Diameter 161 | 38-40 μm |

Turning to FIG. 6, in the illustrated example depicted by the cross-section view 600, an axial passage 622 of the working tip 116 comprises a cylindrical bore 646 that offsets the distal edge of an annular chamfer section 627 from a working surface 628 by a distance 602. Further, the working surface 628 includes an annular lip 660 that protrudes from the working surface 628. The annular lip 660, cylindrical bore 646, and annular chamfer section 627 together form a chamber 652 that confines bond splash, as described above. The annular lip 660 has a diameter 604 greater than a diameter 606 of the cylindrical bore 646, thereby leading the annular lip 660 to be offset from the opening 608 formed at the distal end of the cylindrical bore 646. This offset permits the annular lip 660 to enclose a larger region around a ball joint during the bonding process, but may be less effective at displacing bond pad material up against the wire ball than the implementation illustrated in FIG. 5.

In the example implementation illustrated by the cross-section view 700 of FIG. 7, an axial passage 722 of the working tip 116 comprises a cylindrical bore 746 that offsets the distal edge of an annular chamfer section 727 from a substantially flat working surface 728 by a distance 704. The working surface 728 forms an annular ring portion 702 that comprises a substantially flat annular surface that circumscribes the cylindrical bore 746. The cylindrical bore 746 and the annular chamfer section 727 form a chamber 752 to confine bond splash. The annular ring portion 702 has a non-zero acute face angle 706 relative to a longitudinal axis 724 of the capillary 102 that impacts the heel thickness of a stitch bond formed by the cleavage of the bonding wire via the annular protrusion formed by the perimeter edge 754 of an opening 726 at the working face 728 resulting from the intersection of the annular ring portion 702 and the cylindrical bore 746. Moreover, the face angle 706 defines the angle 708 of intersection between the wall of the cylindrical bore 746 and the annular ring portion 702, and thus defines the wedge profile presented by the annular protrusion formed therefrom. With the substantially flat working face 728, the working tip 116 of FIG. 7 is well suited for applying even pressure over a large area of a bonding wire during the stitch bonding process, but may not be as well suited for penetration of the bond pad substrate during the ball bonding process as implementations utilizing a protruding annular lip, such as those implementations shown in FIGS. 1, 5, and 6.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method for bonding a wire to a substrate, the method comprising:
   forming a wire ball at a wire at a working tip of a capillary;
   contacting the wire ball to a substrate via the capillary;
   driving a protrusion at the working tip of the capillary into contact with a region of the substrate surrounding the wire ball;
   forming a stitch bond with the wire at a substrate using the capillary; and
   cleaving at least a portion of the wire at the stitch bond by penetrating the wire with the protrusion.

2. The method of claim 1, wherein:
   driving the protrusion at the working tip of the capillary into contact with the region of the substrate surrounding the wire ball comprises driving the protrusion of the working tip into the region of the substrate so that substrate material within the region is contained within a chamber formed by the working tip.

3. The method of claim 1, wherein:
   driving the protrusion into contact with the region of the substrate surrounding the wire ball comprises penetrating a surface of the substrate with the protrusion so that substrate material at the region is pressed against a sidewall of the wire ball.

4. The method of claim 1, wherein:
   the wire is composed of copper (Cu); and
   the substrate comprises a pad composed of aluminum (Al).

5. The method of claim 1, wherein the protrusion comprises at least one of: a protruding annular lip circumscribing an opening of an axial passage at a working face of the working tip; a perimeter edge of an opening of an axial passage at a flat working face of the working tip, the flat working face at a non-zero acute angle relative to a longitudinal axis of the axial passage; a protruding annular lip defines a portion of a cylindrical bore at the working face; and a protruding annular lip that is offset from an opening defined by a cylindrical bore at the working face.

6. A capillary for wire bonding a wire to a substrate, the capillary comprising:
   a working face;

a first annular chamfer section;
a cylindrical bore offsetting the annular chamfer section from the working face; and
wherein the first annular chamfer section comprises:
a first annular chamfer; and
a second annular chamfer disposed between the first annular chamfer and the cylindrical bore and having an inside chamfer angle greater than an inside chamfer angle of the first annular chamfer.

7. The capillary of claim 6, wherein:
the working face comprises a protruding annular lip that defines a portion of the cylindrical bore at the working face.

8. The capillary of claim 7, wherein:
the working face further comprises a flat annular surface extending from the protruding annular lip.

9. The capillary of claim 6, wherein:
the working face comprises a flat annular surface extending from a perimeter of the cylindrical bore.

10. The capillary of claim 6, further comprising:
a capillary body comprising a working tip comprising the working face, the capillary body defining an axial passage extending from the working face along a longitudinal axis of the capillary, the axial passage comprising:
the cylindrical bore, wherein the cylindrical bore extends internally from the working face; and
the first annular chamfer having a major diameter defined by the cylindrical bore.

11. The capillary of claim 10, wherein the
second annular chamfer has a major diameter defined by a minor diameter of the first annular chamfer.

12. The capillary of claim 10, wherein a length of the cylindrical bore is at least one-fourth of a diameter of the cylindrical bore.

13. The capillary of claim 10, wherein the working tip comprises a protruding annular lip.

14. The capillary of claim 10, wherein the working face comprises a flat annular surface circumscribing an opening of the cylindrical bore.

15. A bonding tool comprising the capillary of claim 6, the bonding tool further comprising:
a servo system to drive a protrusion at the working face of the capillary into contact with a surface of the substrate during formation of a wire bond at the substrate.

16. A method for bonding a wire to a substrate, the method comprising:
forming a wire ball at a wire at a working tip of a capillary;
contacting the wire ball to a substrate via the capillary;
performing an ultrasonic scrub process to initiate plastic deformation of the wire ball subsequent to contacting the wire ball to the substrate; and
after performing the ultrasonic scrub process, driving a protrusion at the working tip of the capillary into contact with a region of the substrate surrounding the wire ball.

17. The method of claim 16, wherein:
driving the protrusion at the working tip of the capillary into contact with the region of the substrate surrounding the wire ball comprises driving the protrusion of the working tip into the region of the substrate so that substrate material within the region is contained within a chamber formed by the working tip.

18. The method of claim 16, wherein:
driving the protrusion into contact with the region of the substrate surrounding the wire ball comprises penetrating a surface of the substrate with the protrusion so that substrate material at the region is pressed against a sidewall of the wire ball.

19. The method of claim 16, wherein the protrusion comprises at least one of: a protruding annular lip circumscribing an opening of an axial passage at a working face of the working tip; a perimeter edge of an opening of an axial passage at a flat working face of the working tip, the flat working face at a non-zero acute angle relative to a longitudinal axis of the axial passage; a protruding annular lip that defines a portion of a cylindrical bore at the working face; and a protruding annular lip that is offset from an opening defined by a cylindrical bore at the working face.

20. A capillary for wire bonding a wire to a substrate, the capillary comprising:
a working face;
a first annular chamfer section;
a cylindrical bore offsetting the annular chamfer section from the working face; and
wherein the working face comprises:
a protruding annular lip that defines a portion of the cylindrical bore at the working face the protruding annular lip having a wedge profile formed by a parallel walled portion that forms a segment of the cylindrical bore and an angled wall portion at a non-zero angle relative to the parallel walled portion; and
a flat annular surface extending from the protruding annular lip at a non-zero acute angle relative to a longitudinal axis of the cylindrical bore.

21. The capillary of claim 20, wherein:
the protruding annular lip is one of: a protruding annular lip that defines a portion of the cylindrical bore at the working face; and a protruding annular lip that is offset from an opening defined by a cylindrical bore at the working face.

22. A bonding tool comprising the capillary of claim 20, the bonding tool further comprising:
a servo system to drive the protruding annular lip of the capillary into contact with a surface of the substrate during formation of a wire bond at the substrate.

23. The bonding tool of claim 22, wherein the servo system further is to:
manipulate the capillary to form a stitch bond with the wire at a substrate; and
drive the protruding annular lip of the capillary into the wire to cleave at least a portion of the wire at the stitch bond.

24. The bonding tool of claim 22, further comprising:
an ultrasonic transducer to perform an ultrasonic scrub process to initiate plastic deformation of a wire ball subsequent to contacting the wire ball to the substrate and prior to the servo system driving the protruding annular lip of the capillary into contact with the surface of the substrate.

* * * * *